(12) United States Patent
Kwon et al.

(10) Patent No.: US 6,271,105 B1
(45) Date of Patent: Aug. 7, 2001

(54) METHOD OF FORMING MULTIPLE WELLS IN A SEMICONDUCTOR INTEGRATED CIRCUIT USING FEWER PHOTOLITHOGRAPHY STEPS

(75) Inventors: Joon-mo Kwon, Kyungki-do; Sung-young Lee, Seoul, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/316,038

(22) Filed: May 21, 1999

(30) Foreign Application Priority Data

Jun. 15, 1998 (KR) .................................................. 98-22393

(51) Int. Cl.⁷ ................................................ H01L 21/265
(52) U.S. Cl. .......................... 438/524; 438/526; 438/519; 438/527
(58) Field of Search .................................. 438/519, 202, 438/526, 208, 527, 204, 205, 203, 234, 414, 524

(56) References Cited

U.S. PATENT DOCUMENTS

| | | | |
|---|---|---|---|
| 5,134,085 | * 7/1992 | Gilgen et al. | 437/52 |
| 5,234,856 | * 8/1993 | Gonzalez | 437/47 |
| 5,460,984 | * 10/1995 | Yoshida | 437/28 |
| 5,604,150 | * 2/1997 | Mehrad | 437/70 |

* cited by examiner

Primary Examiner—Olik Chaudhuri
Assistant Examiner—Shrinivas H. Rao
(74) Attorney, Agent, or Firm—Jones Volentine, PLLC

(57) ABSTRACT

A method is provided for forming a multiple well of a semiconductor device is provided. By this method, a pocket well region of a first conductivity type is formed over a predetermined first region of a semiconductor substrate of a first conductivity type, using a first photolithography process. A first deep well region of a second conductivity type is then formed under the pocket well region in a self-aligned manner. A peripheral well region of the first conductivity type is selectively formed in a predetermined second region of the semiconductor substrate apart from the pocket well region, using a second photolithography process. An ion-implantation mask covering the pocket well region and the peripheral well region of the first conductivity type is formed using a third photolithography process, and is used to form a peripheral well region of the second conductivity type and a second deep well region of the second conductivity type in a self-aligned manner under the peripheral well region of the second conductivity type, in the exposed areas of the semiconductor substrate. In this way, a triple well region is formed using only three photolithography processes.

32 Claims, 3 Drawing Sheets

METHOD OF FORMING MULTIPLE WELLS IN A SEMICONDUCTOR INTEGRATED CIRCUIT USING FEWER PHOTOLITHOGRAPHY STEPS

This application relies for priority upon Korean Patent Application No. 8-22393, filed on Jun. 15, 1998, the contents of which are herein incorporated by reference in their entirety.

BACKGROUND OF THE INVENTION

The present invention relates to a method for forming a well of a semiconductor integrated circuit, and more particularly, to a method for forming a multiple well.

A low power semiconductor integrated circuit generally includes MOS transistors. A MOS transistor may be an NMOS transistor or a PMOS transistor, and a CMOS circuit including both NMOS transistors and PMOS transistors has the lowest power consumption of currently-available integrated circuits. So, if a CMOS circuit is employed for a semiconductor integrated circuit, NMOS transistors and PMOS transistors are both formed on a single substrate.

Generally NMOS transistors are formed in P-well regions, and PMOS transistors are formed in N-well regions. Furthermore, in order to apply various back biases to a plurality of NMOS transistors constituting the semiconductor integrated circuit, e.g, two NMOS transistors, the two NMOS transistors must be formed in P-well regions which are isolated from each other. Furthermore, if the semiconductor substrate is p-type, any P-well regions formed directly in the p-type substrate will be electrically connected to each other through the semiconductor substrate. Thus, at least one of the two P-well regions must be surrounded by a well region having a conductivity type different from that of the semiconductor substrate, e.g., an N-well region. Such technology for forming a pocket P-well region in the p-type semiconductor substrate, surrounded with an N-well region, a P-well region directly formed on the p-type semiconductor substrate, and an N-well region directly formed in the p-type semiconductor substrate is called triple well technology.

If cell transistors constituting the cell array region of a semiconductor memory are formed in a pocket P-well region formed by the triple well technology, a soft error rate (SER) due to alpha particles can be reduced. Accordingly, the triple well technology is widely employed for the most highly integrated semiconductor memories.

In FIGS. 1 through 4, reference characters "a" and "b" denote a cell array region and a peripheral circuit region, respectively.

Referring to FIG. 1, a first photoresist pattern 3, exposing a cell array region a, is formed over a semiconductor substrate 1, e.g., a p-type semiconductor substrate. Subsequently, a first ion implantation process $I_1$, for implanting an n-type impurity into the semiconductor substrate 1, is performed using the first photoresist pattern 3 as an ion implantation mask. This forms a deep N-well region 5 to a predetermined depth from the surface of the semiconductor substrate 1.

Referring to FIG. 2, the first photoresist pattern 3 is removed, and a second photoresist pattern 7 exposing the cell array region a is formed. However, the region exposed by the second photoresist pattern 7 is narrower than that exposed by the first photoresist pattern 3. A second ion implantation process $I_2$ for implanting a p-type impurity into the surface of the semiconductor substrate 1 is performed using the second photoresist pattern 7 as an ion implantation mask. This forms a pocket P-well region 9 above the deep N-well region 5. The pocket P-well region 9 is narrower than that of the deep N-well region 5, as shown in FIG. 2. After performing the second ion implantation process $I_2$, an ion implantation process for optimizing the characteristics of a cell transistor, e.g., an ion implantation process for controlling a threshold voltage, is then performed on the surface of the pocket P-well region 9, using the second photoresist pattern 7.

Referring to FIG. 3, the second photoresist pattern 7 is removed, and a third photoresist pattern 11 partially exposing the peripheral circuit region b is formed. A third ion implantation process $I_3$ for implanting a p-type impurity into the surface of the semiconductor substrate 1 is performed using the third photoresist pattern 11 as an ion implantation mask. This forms a P-well region 13 in a predetermined area of the peripheral circuit region b. After the third ion implantation process $I_3$, an ion implantation process for optimizing the characteristics of an NMOS transistor of a peripheral circuit, e.g., an ion implantation process for controlling a threshold voltage, is then performed on the surface of the P-well region 13, using the third photoresist pattern 11 as an ion implantation mask.

Referring to FIG. 4, the third photoresist pattern 11 is removed, and a fourth photoresist pattern 15 covering the pocket P-well region 9 and the P-well region 13 is formed. A fourth ion implantation process $I_4$ for implanting an n-type impurity into the surface of the semiconductor substrate 1 is performed using the fourth photoresist pattern 15 as an ion implantation mask. This forms an N-well region 17 in the peripheral circuit region b.

Subsequently, the semiconductor substrate is annealed to activate the impurities implanted into the ion implantation regions. The N-well region 17 is connected to the edges of the deep N-well region 5 formed in the cell array region a, as shown in FIG. 4. Thus, the pocket P-well region 9 is completely isolated from the semiconductor substrate 1 by the deep N-well region 5 and the N-well region 17 of the peripheral circuit region b.

In the conventional art, four photolithography processes are required to form a triple well. Also, if misalignment occurs between the first photoresist patten for defining the deep N-well region and the second photoresist pattern for defining the pocket P-well region, the pocket P-well region is not completely isolated from the semiconductor substrate. Thus, in order to increase a process margin with respect to the misalignment, a well design rule must be increased. However, if the well design rule is increased, the size of individual elements cannot be easily reduced and it becomes difficult to increase the integration of the semiconductor device.

SUMMARY OF THE INVENTION

It is an objective of the present invention to provide a method for forming a multiple well of a semiconductor device, requiring fewer photolithography processes, to simplify the manufacturing process, and allowing a reduced a well design rule.

Accordingly, to achieve the above objective, in the present invention, a first ion implantation mask is formed over a semiconductor substrate of a first conductivity type, e.g., p-type, exposing a predetermined first region of the semiconductor substrate.

A first deep well region of a second conductivity type is formed by performing a first ion implantation process for implanting an impurity of a second conductivity type, e.g., n-type, into the first region of the semiconductor substrate, exposed by the first ion-implantation mask. The first deep well region of the second conductivity type is formed to a predetermined depth from the surface of the semiconductor substrate. Subsequently, a pocket well region of the first conductivity type is formed over the first deep well region by performing a second ion implantation process for implanting an impurity of a first conductivity type into the first region of the semiconductor substrate exposed by the first ion-implantation mask.

The first and second ion implantation processes may be performed in either order. The pocket well region may be formed first, then the first deep well region formed second, or the first deep well region can be formed first and the pocket well region formed second.

The first ion-implantation mask is then removed, and a second ion-implantation mask exposing a predetermined second region of the semiconductor substrate apart from the pocket well region is formed. A first peripheral well region of the first conductivity type is formed by performing a third ion implantation process for implanting an impurity of the first conductivity type into the second region of the semiconductor substrate, exposed by the second ion-implantation mask.

The second ion-implantation mask is removed, and a third ion-implantation mask covering the pocket well region and the first peripheral well region is formed. A second peripheral well region of the second conductivity type is formed by performing a fourth ion implantation process for implanting an impurity of the second conductivity type into a portion of the semiconductor substrate exposed by the third ion-implantation mask. Subsequently, a second deep well region of the second conductivity type is formed under the peripheral well region of the second conductivity type by performing a fifth ion implantation process for implanting an impurity of the second conductivity type into the portion of the semiconductor substrate exposed by the third ion-implantation mask with an energy higher than that for the fourth ion implantation process.

The fourth and fifth ion implantation processes may be performed in either order. The second peripheral well region may be formed first, then the second deep well region formed second, or the second deep well region can be formed first and the second peripheral well region formed second.

Preferably, the first and second deep well regions are formed to have the same depths with each other so that the pocket well region of the first conductivity type is completely isolated from the semiconductor substrate by the peripheral well region of the second conductivity type, the first deep well region and the second deep well region.

The impurities implanted into the respective well regions are preferably diffused by annealing the resultant structure. The first through third ion-implantation masks are preferably formed of photoresist patterns.

Preferably, a deep well region of a first conductivity type is further formed under the first peripheral well region of the first conductivity type by implanting the impurity of a first conductivity type into the second region of the semiconductor substrate, exposed by the second ion-implantation mask with an energy higher than that for the third ion implantation process.

According to the present invention, a triple well region can be formed using three photolithography processes. As a result, the number of photolithography processes is reduced, which simplifies the process of manufacturing a semiconductor device.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENTS

Figure 1:
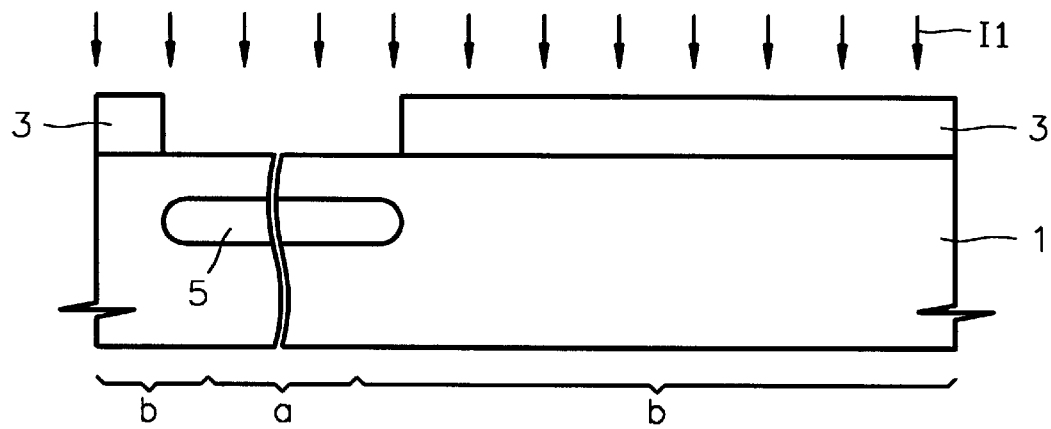
FIGS. 1 through 4 are sectional views illustrating a related method for forming a multiple well.
Figure 2:
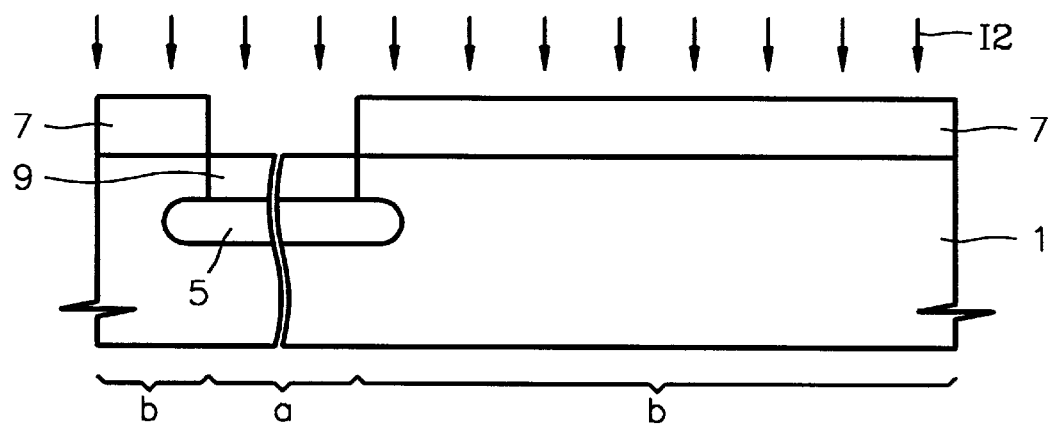
Figure 3:
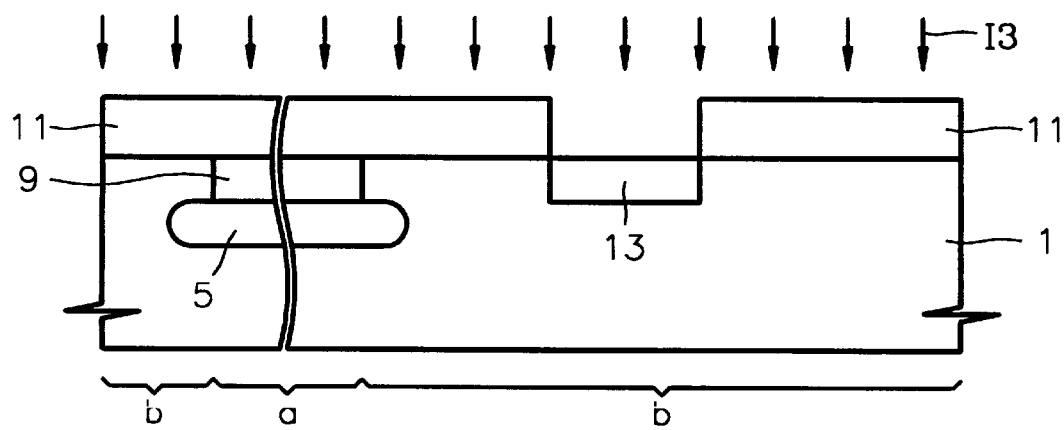
Figure 4:
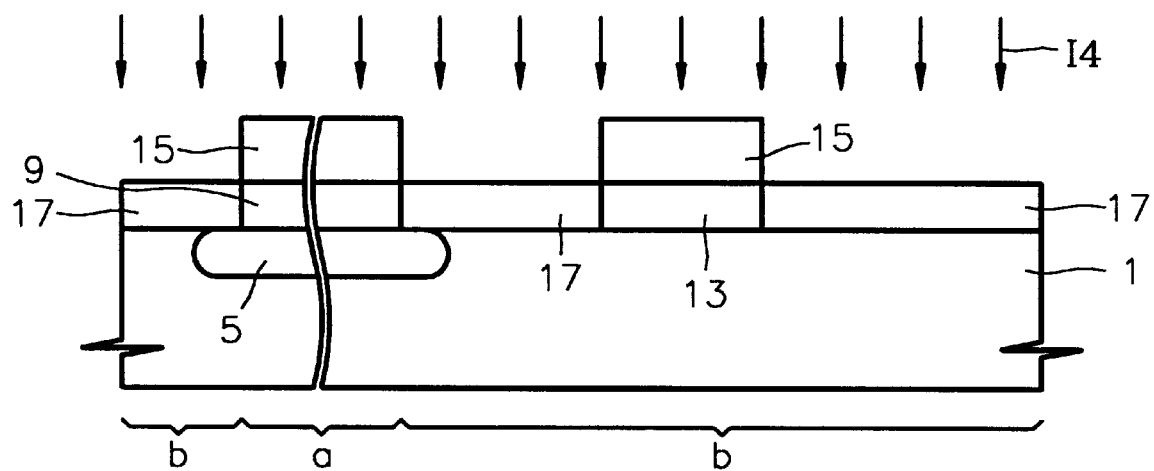
Figure 5:
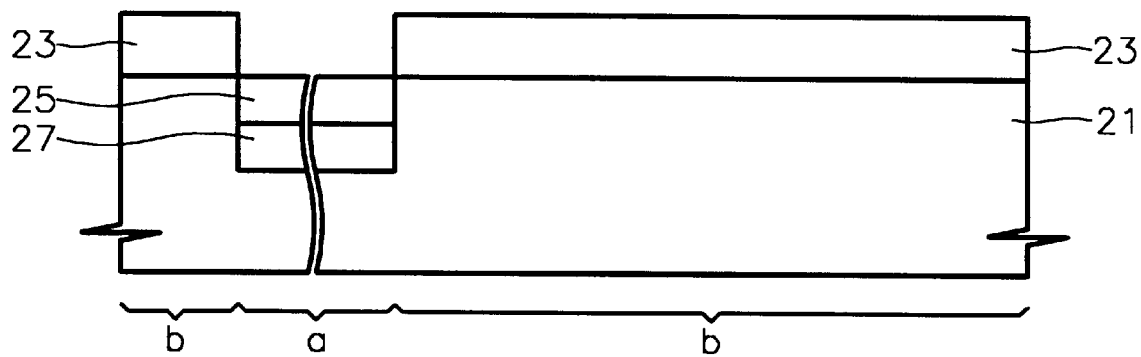
FIGS. 5 through 7 are sectional views illustrating a method for forming a multiple well according to a preferred embodiment of the present invention.
Figure 6:
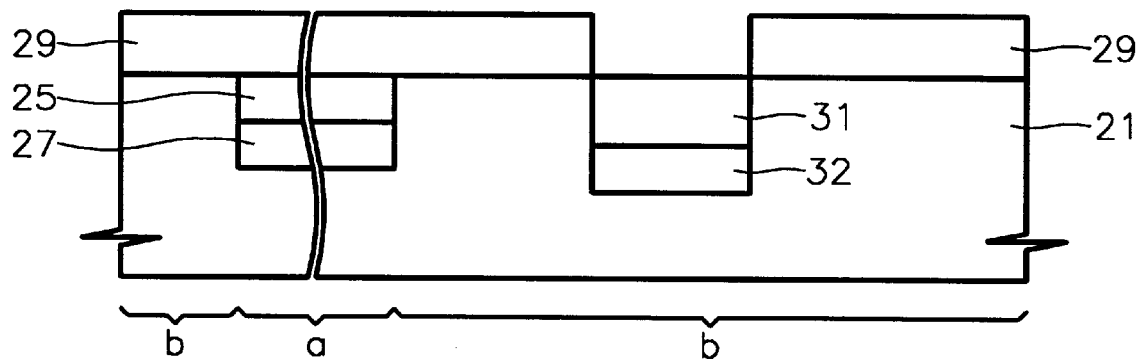
Figure 7:
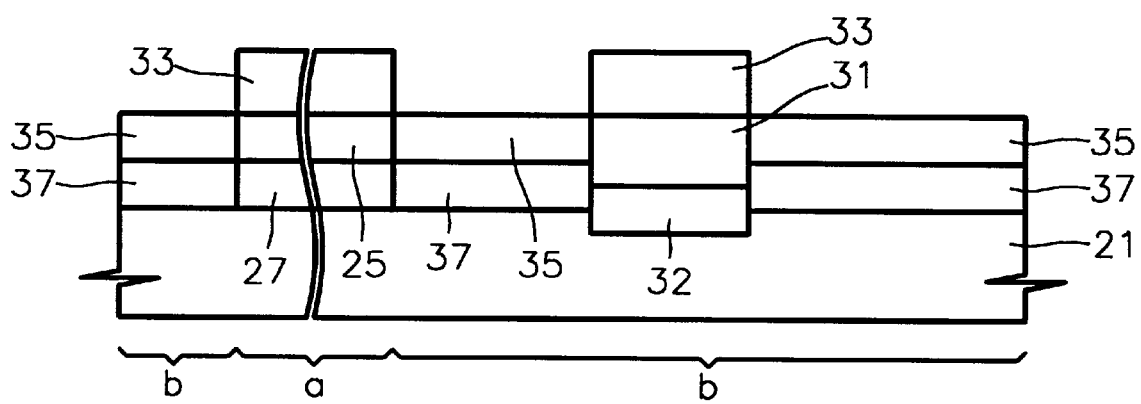

FIGS. 5 through 7 are sectional views illustrating a method for forming a multiple well according to a preferred embodiment of the present invention. In FIGS. 5 through 7, reference characters a and b respectively denote a cell array region and a peripheral circuit region of a semiconductor memory. However, despite the fact that the preferred embodiment is directed to a semiconductor memory, it should be clear that the present invention can be used for the fabrication of all semiconductor integrated circuits having MOS transistors without being limited to semiconductor memories.

Referring to FIG. 5, a first ion implantation mask 23 exposing a predetermined first region of the semiconductor substrate, i.e., a cell array region, is formed over a semiconductor substrate 21 of a first conductivity type, such as a p-type semiconductor substrate. Preferably, the first ion implantation mask 23 is a photoresist pattern.

An impurity of a first conductivity type, e.g., boron (B) ions, is implanted into the first region of the semiconductor substrate 21, exposed by the first ion implantation mask 23, preferably with an energy of about 500 keV and a dose of about $1.0 \times 10^{13}$ ion atoms/cm$^2$, to form a pocket well region 25 of the first conductivity type. Also, phosphorus (P) ions corresponding to an impurity of a second conductivity type, i.e., an n-type impurity, are implanted into the semiconductor substrate 21 exposed by the first ion implantation mask 23, preferably with an energy of 1.2 MeV and a dose of preferably $1.0 \times 10^{13}$ ion atoms/cm$^2$, to form a first deep well region 27 of a second conductivity type having a projection range ($R_p$) below the pocket well region 25. In the alternative, the pocket well region 25 can be formed after forming the first deep well region 27 instead of before.

Preferably, a shallow ion implantation process for optimizing a channel profile of a MOS transistor is also performed on the surface of the semiconductor substrate exposed by the first ion implantation mask 23, i.e., the surface of the pocket well region 25.

Referring to FIG. 6, the first ion implantation mask 23 is removed, and a second ion implantation mask 29, e.g. a photoresist pattern, is formed over the semiconductor substrate 21. The second ion implantation mask 29 exposes a predetermined second region of the peripheral circuit region b. An impurity of a first conductivity type, e.g., boron (B) ions, is implanted into the second region of the semiconductor substrate 21, exposed by the second ion implantation mask 29, preferably with an energy of 700 keV and a dose of about $1.0 \times 10^{13}$ ion atoms/cm$^2$, to form a first peripheral well region 31 of a first conductivity type. The ion implantation energy for forming the first peripheral well region 31 of the first conductivity type may be the same as that for forming the pocket well region 25.

Also, an impurity of the first conductivity type, e.g., boron (B) ions, may be implanted into the semiconductor substrate 21 exposed by the second ion implantation mask 29, with an energy of approximately 1.0 MeV and a dose of $1.0 \times 10^{13}$ ion atoms/cm$^2$, to form a deep well region 32 of the first conductivity type under the first peripheral well region 31 of the first conductivity type. This deep well region 32 acts to prevent a phenomenon of punch-through from occurring between the peripheral well regions of the second conductivity type formed on both sides of the first peripheral well region 31 of the first conductivity type during subsequent processes. Thus, the deep well region 32 of the first conductivity type may have a higher concentration than the first peripheral well region 31 of the first conductivity type.

Preferably, a shallow ion implantation process is also performed to optimize a channel profile of a MOS transistor, on the surface of the semiconductor substrate exposed by the second ion implantation mask 29, i.e., the first peripheral well region 31 of the first conductivity type.

Referring to FIG. 7, the second ion implantation mask 29 is removed, and a third ion implantation mask 33 is formed covering the pocket well region 25 and the first peripheral well region 31 of the first conductivity type. Preferably, the third ion implantation mask 33 is also a photoresist pattern. Impurities of a second conductivity type, e.g., phosphorus (P) ions, corresponding to an n-type impurity, are implanted into the semiconductor substrate 21 exposed by the third ion implantation mask 33, to form a second peripheral well region 35 of a second conductivity type. Preferably, the second peripheral well region 35 of the second conductivity type is formed by implanting P ions with an energy of approximately 800 keV and a dose of about $1.0 \times 10^{13}$ ion atoms/cm$^2$, to have the same depth as the pocket well region 25.

Also, impurities of a second conductivity type, e.g., phosphorus (P) ions, of an n-type impurity, are deeply implanted into the semiconductor surface 21 exposed by the third ion implantation mask 33, to form a second deep well region 37 of a second conductivity type, under the second peripheral well region 35 of the second conductivity type. Preferably, the second deep well region 37 of the second conductivity type has the same depth as the first deep well region 27. In detail, it is preferable that the second deep well region 37 is formed of P-ions with an energy of approximately 1.2 MeV and a dose of about $1.0 \times 10^{13}$ ion atoms/cm$^2$.

The second deep well region 37 may have a higher concentration than the second peripheral well region 35. If the concentration of the second deep well region 37 is higher than that of the second peripheral well region 35 of the second conductivity type, the well regions 35 and 37 of the second conductivity type formed in the peripheral circuit region b show a concentration profile of a retrograde well. In this case, the latch-up characteristics of a CMOS circuit formed in the peripheral circuit region b can be improved.

Subsequently, the semiconductor substrate where the well regions described with reference to FIGS. 5 through 7 are formed, i.e., the pocket well region 25, the first deep well region 27, the first peripheral well region 31 of the first conductivity type, the second peripheral well region 35 of the second conductivity type and the second deep well region 37, are preferably annealed, to diffuse the impurities of the well regions. The annealing is preferably performed through a subsequent process, e.g., a thermal oxide process for forming a gate oxide layer of the MOS transistor, although an additional annealing process may be used. Preferably, the additional annealing process is performed at approximately 850° C., under a nitrogen atmosphere for approximately 150 min.

According to the present invention, the first conductivity type pocket well region 25 is completely surrounded by the first deep well region 27 of the second conductivity type, the second deep well region 37 of the second conductivity type and the peripheral well region 35 of the second conductivity type, and may be formed through only three photolithography processes. As a result of this process, the pocket well region 25 of the first conductivity type and the peripheral well region 31 of the first conductivity type are completely isolated from each other. As a result, various back biases can be applied to the MOS transistors formed in the pocket well region 25 of the first conductivity type and the peripheral well region 31 of the first conductivity type. As a result, a high performance semiconductor integrated circuit can be manufactured more simply.

Also, the deep well region 32 of the first conductivity type is formed, to suppress the phenomenon of punch through between the peripheral well regions 35 of the second conductivity type formed on both sides of the peripheral well region 31 of the first conductivity type. Thus, this process allows various MOS transistors capable of applying various back biases to the peripheral circuit region b to be realized.

The present invention is not limited to the illustrated embodiment and many changes and modifications can be made within the scope of the invention by a person skilled in the art. For example, the present invention can be adopted to a method for forming an n-type pocket well region surrounded by a p-type first deep well region, a p-type second deep well region, and a p-type second peripheral well region.

What is claimed is:

1. A method for forming a multiple well of a semiconductor device, comprising:

forming a first ion implantation mask over a semiconductor substrate of a first conductivity type to expose a first region of the semiconductor substrate;

forming a pocket well region of the first conductivity type by ion-implanting an impurity of the first conductivity type into the first region of the semiconductor substrate;

forming a first deep well region of a second conductivity type under the pocket well region and aligned with the pocket well region by ion-implanting an impurity of the second conductivity type into the first region of the semiconductor substrate;

removing the first ion-implantation mask;

forming a second ion-implantation mask exposing a second region of the semiconductor substrate apart from the pocket well region;

forming a first peripheral well region of the first conductivity type by implanting an impurity of the first conductivity type into the second region of the semiconductor substrate;

removing the second ion-implantation mask;

forming a third ion-implantation mask covering the pocket well region and the peripheral well region;

forming a second peripheral well region of the second conductivity type by implanting an impurity of the second conductivity type into portions of the semiconductor substrate exposed by the third ion-implantation mask; and forming a second deep well region of the second conductivity type under the peripheral well region of the second conductivity type by implanting an impurity of the second conductivity type into the portion of the semiconductor substrate exposed by the third ion-implantation mask.

2. A method for forming a multiple well of a semiconductor device, as recited in claim 1, further comprising diffusing impurities of the pocket well region, the first deep well region, the first peripheral well region, the second peripheral well region, and the second deep well region, by annealing the semiconductor substrate.

3. A method for forming a multiple well of a semiconductor device, as recited in claim 1, wherein the first through third ion-implantation masks are photoresist patterns.

4. A method for forming a multiple well of a semiconductor device, as recited in claim 1, wherein the first conductivity type is p-type and the second conductivity type is n-type.

5. A method for forming a multiple well of a semiconductor device, as recited in claim 4, wherein the impurity of the first conductivity type is boron.

6. A method for forming a multiple well of a semiconductor device, as recited in claim 1, wherein the first conductivity type is n-type and the second conductivity type is p-type.

7. A method for forming a multiple well of a semiconductor device, as recited in claim 6, wherein the impurity of the second conductivity type is phosphorus.

8. A method for forming a multiple well of a semiconductor device, as recited in claim 1, wherein the first peripheral well region and the pocket well region are formed to the same depth.

9. A method for forming a multiple well of a semiconductor device, as recited in claim 1, wherein the first peripheral well region is deeper than the pocket well region.

10. A method for forming a multiple well of a semiconductor device, as recited in claim 1, wherein the second deep well region is formed to the same depth as the first deep well region.

11. A method for forming a multiple well of a semiconductor device, as recited in claim 1, wherein the pocket well region and the second peripheral well region are formed to the same depth.

12. A method for forming a multiple well of a semiconductor device, as recited in claim 1, further comprising forming a third deep well region of the first conductivity type under the first peripheral well region by implanting an impurity of the first conductivity type into the second region of the semiconductor substrate.

13. A method for forming a multiple well of a semiconductor device, as recited in claim 12, wherein the third deep well region is formed before the first peripheral well region is formed.

14. A method for forming a multiple well of a semiconductor device, as recited in claim 12, wherein the first peripheral well region is formed before the third deep well region is formed.

15. A method for forming a multiple well of a semiconductor device, as recited in claim 1, wherein the first deep well region is formed before the pocket well region is formed.

16. A method for forming a multiple well of a semiconductor device, as recited in claim 1, wherein the pocket well region is formed before the first deep well region is formed.

17. A method for forming a multiple well of a semiconductor device, as recited in claim 1, further comprising performing an ion-implantation process for controlling the channel profile of a MOS transistor on the first region of the semiconductor substrate.

18. A method for forming a multiple well of a semiconductor device, as recited in claim 1, further comprising performing an ion-implantation process for controlling the channel profile of a MOS transistor on the second region of the semiconductor substrate.

19. A method for forming a triple well of a semiconductor device, comprising:
   forming a first ion-implantation mask over a semiconductor substrate of a first conductivity type to expose a first region of a semiconductor substrate;
   while said first ion implantation mask is disposed over the semiconductor substrate, implanting an impurity of the first conductivity type into the first region of the semiconductor substrate left exposed by the first ion-implantation mask, to thereby form a pocket well region of the first conductivity type;
   while said first ion implantation mask is disposed over the semiconductor substrate, implanting an impurity of the second conductivity type deeper into said first region of the semiconductor substrate than the impurities of the first conductivity type are implanted, to thereby form a first deep well region of a second conductivity type under the pocket well region;
   removing the first ion-implantation mask;
   forming a second ion-implantation mask over the semiconductor substrate to expose a second region of the semiconductor substrate spaced laterally apart from said first region;
   while said second ion-implantation mask is disposed over said semiconductor substrate, implanting an impurity of the first conductivity type into the second region of the semiconductor substrate left exposed by the second ion-implantation mask, to thereby form a first peripheral well region of the first conductivity type;
   removing the second ion-implantation mask;
   subsequently forming a third ion-implantation mask covering the pocket well region and the first peripheral well region of the first conductivity type;
   while said third ion-implantation mask covers the pocket well region and the peripheral well region, implanting an impurity of the second conductivity type into a region of the semiconductor substrate left exposed by the third ion-implantation mask and to a depth equal to that of the pocket well region, to thereby form a second peripheral well region of the second conductivity type extending laterally of and between the pocket well region and the first peripheral well region; and
   while said third ion-implantation mask covers the pocket well region and the peripheral well region, implanting an impurity of the second conductivity type into region of the semiconductor substrate left exposed by the third ion-implantation mask and to a depth equal to that of the first deep well region, to thereby form a second deep well region of the second conductivity type under the peripheral well region and extending laterally of and between the first deep well region and the first peripheral well region.

20. The method of claim 19, further comprising annealing the substrate to diffuse the impurities of the pocket well region, the first deep well region, the first peripheral well region of the first conductivity type, the second peripheral well region of the second conductivity type, and the second deep well region.

21. The method of claim 19, wherein each of the steps of forming an ion-implantation mask comprises forming a patterned photoresist over the substrate.

22. The method of claim 19, wherein each of the steps of implanting an impurity of the first conductivity type comprises implanting a p-type of impurity.

23. The method of claim 22, wherein each of the steps of implanting an impurity of the first conductivity type comprises implanting ions of boron into the semiconductor substrate.

24. The method of claim 19, wherein each of the steps of implanting an impurity of the first conductivity type comprises implanting an n-type of impurity.

25. The method of claim 24, wherein each of the steps of implanting an impurity of the second conductivity type comprises implanting ions of phosphorous into the semiconductor substrate.

26. The method of claim 19, wherein the step of implanting an impurity to form the first peripheral well region comprises implanting an impurity of the second conductivity type to a depth equal to that to which the impurities are implanted in forming the pocket well region.

27. The method of claim 19, wherein the step of implanting an impurity to form the first peripheral well region comprises implanting an impurity of the second conductivity type to a depth greater than that to which the impurities are implanted in forming the pocket well region.

28. The method of claim 19, further comprising implanting an impurity of the first conductivity type into the second region of the semiconductor substrate to a depth greater than that to which impurities are implanted in forming the first peripheral well region, while said second ion-implantation mask is disposed over said semiconductor substrate, to thereby form a third deep well region under the first peripheral well region.

29. The method of claim 28, wherein the third deep well region is formed before the first peripheral well region is formed.

30. The method of claim 28, wherein the first peripheral well region is formed before the third deep well region is formed.

31. The method of claim 19, wherein the first deep well region is formed before the pocket well region is formed.

32. The method of claim 19, wherein the pocket well region is formed before the first deep well region is formed.

* * * * *